United States Patent [19]

Hoenig

[11] Patent Number: 4,613,817
[45] Date of Patent: Sep. 23, 1986

[54] SUPERCONDUCTING GRADIOMETER COIL SYSTEM FOR AN APPARATUS FOR THE MULTI-CHANNEL MEASUREMENT OF WEAK NONSTATIONARY MAGNETIC FIELDS

[75] Inventor: Eckhardt Hoenig, Erlangen, Fed. Rep. of Germany

[73] Assignee: Siemens Aktiengesellschaft, Berlin and Munich, Fed. Rep. of Germany

[21] Appl. No.: 620,478

[22] Filed: Jun. 14, 1984

[30] Foreign Application Priority Data

Jul. 5, 1983 [DE] Fed. Rep. of Germany ....... 3324208

[51] Int. Cl.$^4$ .................... G01R 33/02; G01R 33/035
[52] U.S. Cl. .................................................... 324/248
[58] Field of Search ............... 324/248, 244, 245, 260, 324/261, 228, 229, 252; 336/200, 199, 205, 208, DIG. 1; 307/306; 357/5

[56] References Cited

U.S. PATENT DOCUMENTS 4,320,341 3/1982 Lutes .................................... 324/248
4,386,361 5/1983 Simmonds ...................... 307/306 X
4,518,868 5/1985 Harada et al. ...................... 357/5 X

OTHER PUBLICATIONS

Swithenby, "SQUIDs and their Applications in the Measurement of Weak Magnetic Fields", J. Phys. E: Sci. Instrum., 1980, pp. 801–813.
Williamson et al., "Application of SQUID Sensors to the Investigation of Neutral Activity in the Human Brain", IEEE Trans. on Mag., May 1983, pp. 835–844.
Romani et al., "Biomagnetic Instrumentation", Rev. Sci. Instrm. 53(12), Dec. 1982, pp. 1815–1845.
Clarke, "Advances in SQUID Magnetometers", IEEE Trans. on Electron Devices, vol. ED-27, No. 10, Oct. 1980, pp. 1896–1908.

*Primary Examiner*—Gerard R. Strecker
*Assistant Examiner*—Warren S. Edmonds
*Attorney, Agent, or Firm*—Kenyon & Kenyon

[57] ABSTRACT

A superconducting gradiometer coil system is provided for an apparatus for the multi-channel measurement of weak non-stationary magnetic fields in a field intensity range under $10^{-10}$T. The apparatus includes, in each channel, at least one detection coil and at least one compensation coil comprising a gradiometer coil pair, a superconducting quantum interference device (SQUID) and corresponding superconducting connecting members coupling the coils and the SQUIDs, and electronic apparatus for evaluating, processing and displaying the information generated by the quantum interference devices. The gradiometer coil system permits a relatively simple one-time adjustment and has an active area as small as possible. At least the gradiometer detection and compensation coils and their mutual connecting elements are deposited as planar thin-film structures on a common rigid support body. The compensation coils are combined to form a reference coil arrangement about which the individual detection coils are disposed. In particular, the compensation coils of the reference coil arrangement can be formed at least partially of individual loops which surround each other and lie in one plane.

8 Claims, 3 Drawing Figures

SUPERCONDUCTING GRADIOMETER COIL SYSTEM FOR AN APPARATUS FOR THE MULTI-CHANNEL MEASUREMENT OF WEAK NONSTATIONARY MAGNETIC FIELDS

BACKGROUND OF THE INVENTION

The present invention relates to a superconducting gradiometer coil system for an apparatus for the multi-channel measurement of weak nonstationary magnetic fields in a field intensity range of less than $10^{-10}$T, and especially less than $10^{-12}$T. This apparatus includes in each channel, in addition to at least one detection coil and at least one compensation coil, a superconducting quantum interference device (SQUID) as well as corresponding superconducting connecting means connecting the components, and further comprises electrical apparatus for the evaluation, processing and displaying of the information obtained at the quantum interference elements.

The use of superconducting quantum interference devices which are generally called "SQUIDs" (short for "Superconducting Quantum Interference Devices") is generally known for the measurement of very weak magnetic fields. See, e.g., J. Phy. E.: Sci. Instrum.", vol. 13, 1980, pages 801 to 813 and "IEEE Transactions on Electron Devices", vol. ED-27, no. 10, October 1980, pages 1896 to 1908. A preferred field of application for these devices is medical technology, particularly magnetocardiography and magnetoencephalography, where magnetic heart and brain waves with field intensities on the order of magnitude of 50 pT and 0.1 pT respectively occur. See, e.g., "Biomagnetism-Proceedings of the Third International Workshop on Biomagnetism, Berlin 1980", Berlin/New York, 1981, pages 3 to 31, and "Review of Scientific Instruments", vol. 53, no. 12, December 1982, pages 1815 to 1845.

A device for measuring such biomagnetic fields contains substantially the following components:

1. A SQUID as the field sensor proper with a so-called gradiometer;
2. A flux transformer in the form of a coil arrangement for coupling-in the field to be examined from the gradiometer to the SQUID;
3. Electronic equipment for signal acquisition and processing;
4. Shielding for the earth's magnetic field and external interference fields; and
5. A cryosystem for ensuring superconduction of the sensor and the gradiometer.

The design and operation of such devices with a single channel are known. In these devices, the magnetic field to be detected which is up to 6 orders of magnitude smaller than external interference fields, is inductively coupled, generally via a coil arrangement of superconducting wire, to the circuit with a Josephson contact formed by a radio-frequency (R-F)SQUID. Coil systems called gradiometers of first or higher order are formed by the combination of a sensor coil, also called a detection coil, with one or several compensation coils. With appropriate manual adjustment, the three components of a magnetic field homogeneous in the vicinity of the coils or also its share with a homogeneous gradient can largely be suppressed with such gradiometers and the inhomogeneous biomagnetic near field which is still heavily non-uniform in the vicinity of the gradiometer can be measured. The R-F SQUID is furthermore inductively coupled to a resonant tank circuit, the high frequency voltage of which is phase- or amplitude-modulated by the input signal. Generally, the operating point of the R-F SQUID is fixed by negative feedback via an additional compensation coil and the compensation current is used as a signal which can be evaluated electronically.

The R-F SQUIDs employed in the known systems have a characteristic noise signal. See, for instance, "SQUID Superconducting Quantum Interference Devices and Their Applications", Berlin/New York, 1977, pages 395 to 431. In order to determine the mentioned extremely weak magnetic fields, a signal average must be formed at the individual measuring points with the aid of a multiplicity of individual measurements, for at least the following three reasons, namely, because of the incompleteness of the interference field suppression, because of interference components of biological origin in the near field, and because of the intrinsic noise of the sensor. In order to obtain a three-dimensional field distribution measurements must be taken, in addition, sequentially in time at different locations of the area to be examined. With these measuring methods, the difficulty then exists that coherence of the field data no longer exists over the measuring time required therefor, and in addition, measuring times are obtained which can no longer be demanded clinically.

It has therefore been proposed to take a multi-channel measurement instead of the known single-channel measurement. See, for instance, "Physica", vol. 107 B, 1981, pages 29 and 30. The mutual interference of the channels in an adjacent arrangement as well as the intrinsic noise of the individual channels can be reduced through the use of direct current (d-c) SQUIDs in place of R-F SQUIDs. See, for instance, "IEEE Transactions on Magnetics", vol, MAG-19, no. 3, May 1983, pages 835 to 844. The adjustment of the individual channels of such a multi-channel gradiometer system of modular design is difficult to manage, however.

It is an object of the present invention to provide, for a multichannel device for the measurement of biomagnetic fields, a gradiometer coil system which permits a relatively simple adjustment of all gradiometer coils, which adjustment has to be made only once. The active area of the coil system should be kept as small as possible so that the cryostat which is required and which should be made as small as possible, can be brought as close as possible. It should further be possible to determine with this coil system, the spatial distribution of the magnetic fields during reasonable measuring times, and coherence of the field data should be largely ensured.

SUMMARY OF THE INVENTION

The above and other objects of the present invention are achieved by a gradiometer coil system for an apparatus for the multichannel measurement of weak nonstationary magnetic fields wherein at least the gradiometer coils and their mutual connecting elements are deposited as planar thin-film structures in one or more planes on a rigid, common support body, and wherein the compensation coils of the gradiometer are combined in a reference coil arrangement, around which the individual detection coils are arranged.

The gradiometer coil system according to the invention allows parallel, i.e., simultaneous registration of the field values, if a suitable measuring device is used, from different locations by means of a series of superconducting gradiometer coils which are interlinked with a corresponding number of SQUIDs to form a measuring system. The measuring time can thereby be shortened advantageously in accordance with the number of channels. In addition, the gradiometer coils need to be adjusted only once, using thin-film structures designed in accordance with the invention. With a good optical lithography system, it is possible to achieve a gradiometer balance to 10 ppm which can subsequently be improved still further, for instance, by means of a laser cutting device. Furthermore, since the compensation coils are combined into a reference coil arrangement which requires hardly more space than a single detection coil, a great advantage is obtained that almost the entire area of the support body can be occupied by detection coils for signal detection. The space required for the gradiometer coil system and thus the dimensions of the support body accordingly can be kept small. This is accompanied by a corresponding simplification of the cryostat.

In addition, the so-called isofield contours and consequently, the location of field sources, can be obtained with this gradiometer coil system as if the surfaces of the support body were subdivided into a number of discrete magnetometer coils corresponding to the number of channels, i.e., with the particular advantage that with the system according to the invention, only field differences and not fields are measured, while interference fields are largely compensated.

Advantageous embodiments of the gradiometer coil system will appear in the detailed description which follows.

BRIEF DESCRIPTION OF THE DRAWINGS

The invention will be described in the following detailed description, with reference to the drawings, in which.

DETAILED DESCRIPTION

Figure 1:
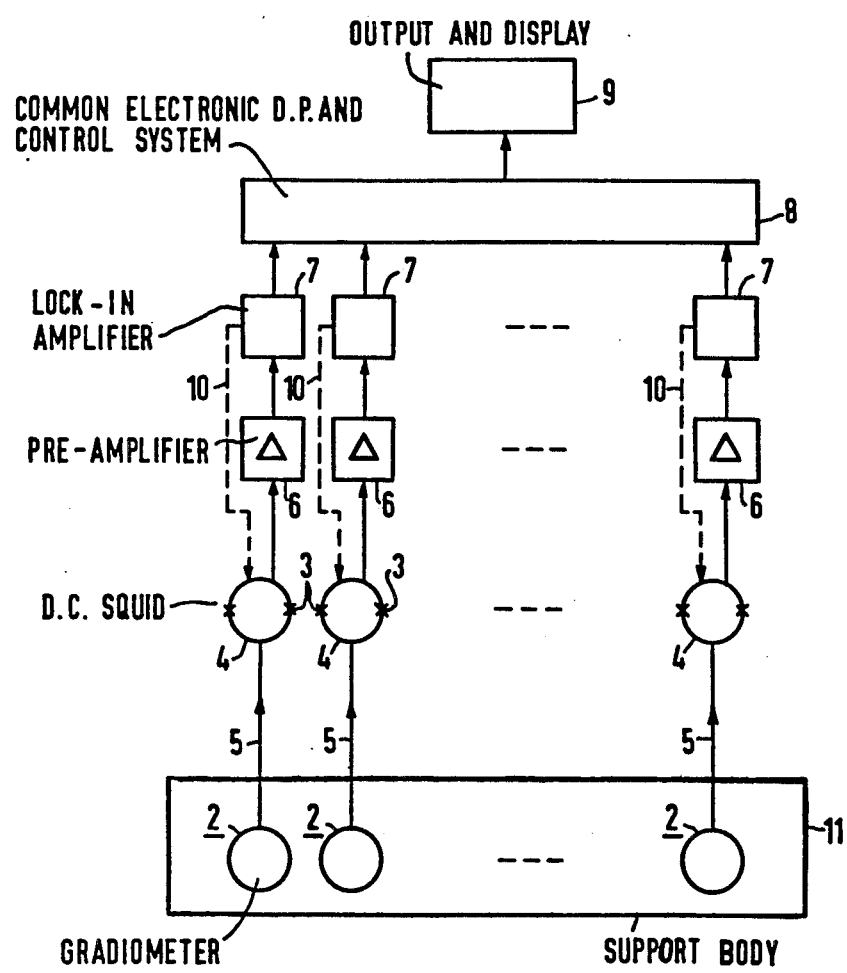
FIG. 1 is a block diagram of a measuring device having a gradiometer coil system according to the present invention.

With reference now to the drawings, FIG. 1 shows the block diagram of a magnetic field measuring device having a predetermined number N of parallel measuring channels. Each channel contains a superconducting first-order gradiometer generally designated as 2, each having two coils serving for detection and compensation, respectively, and a d-c SQUID 4 equipped with two Josephson contacts 3. In addition, in each channel there is provided a superconducting connecting member 5 for connecting the gradiometer to the SQUID. A likewise cooled preamplifier 6 as well as a "lock-in" amplifier 7 is also provided in each channel. The N unprocessed signals from these lock-in amplifiers are fed to a common electronic data processing and control system 8 for further processing and to an output unit 9 for display. A feedback in the channels to the respective SQUIDs from the signals from the lock-in amplifiers 7 is indicated by the dotted lines 10. The signal transmitting directions are indicated in the figure by the arrows in the respective lines.

As further shown in FIG. 1 by dashed lines, at least the gradiometers 2 are to be arranged, according to the invention, on a common rigid support body 11. In contrast to first-order gradiometers of modular design, the advantage of a common precise fabrication on the support body through suitable lithography is thereby obtained. The adjusted gradiometers are therefore combined on a rigid body, i.e., relative motions which could influence the adjustment are therefore precluded. In addition, only a single surface adjustment is necessary with an optically plane support body.

Optionally, support bodies also may be provided, to which, with suitable lithography, the entirety of the SQUIDs 4 as well as the connecting members 5 required between them are applied, in addition to the gradiometer coils. Special superconducting contacts are then no longer necessary.

The simplest arrangement of field sensors is a system of O-order gradiometers, i.e., a plane arrangement of flat cylinder coils or loops arranged side-by-side of superconducting wire or in the form of thin films. For measurements with such a system without additional compensation of extraneous fields, a relatively expensive shielding system is required, however. Less stringent requirements regarding the shielding are posed by first-order gradiometers, one embodiment according to the invention being indicated in FIGS. 2 and 3.

Figure 2:
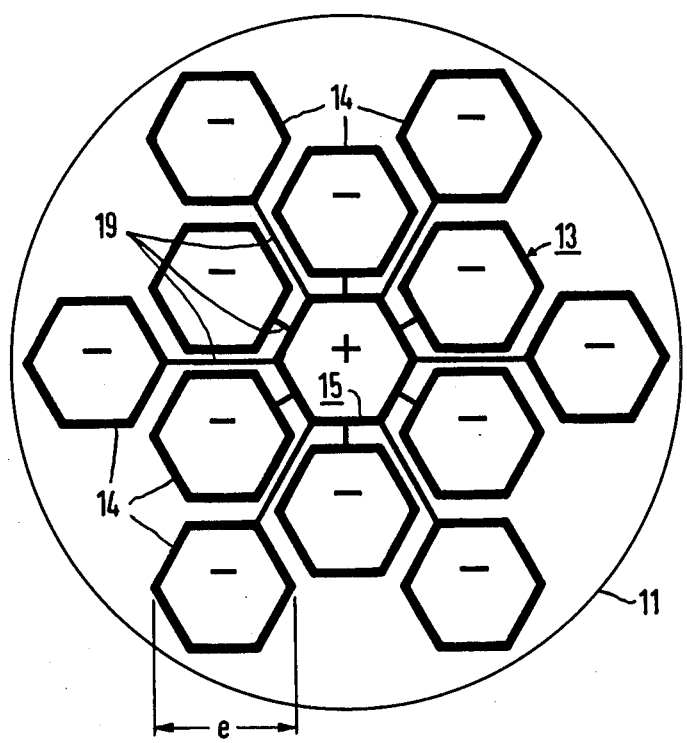
FIG. 2 shows schematically one embodiment of such a gradiometer coil system.

According to FIG. 2, a planar gradiometer coil system, also called a gradiometer array, is placed on a plane support body 11, for instance, a quartz or silicon wafer of about 0.5 mm thickness and a diameter of 10 cm. This system, designated 13, is formed by an array of N detection coils (according to the illustrated embodiment, twelve coils 14) which are arranged around a central reference coil arrangement 15. This reference coil arrangement consists of a corresponding number of compensation coils and is shown in more detail in FIG. 3. According to the embodiment shown, the detection coils 14 and the reference coil arrangement 15 have the shape of hexagons, the distance e between opposite coils of the hexagon generally depending on the distance of the source to be detected. This distance can therefore be in the order of magnitude of several centimeters and is, for example, approximately 20 mm. Other regular forms also can be provided for the coils, for instance, round forms in particular. The individual coils have dimensions which differ slightly from each other. The width of their conductors as well as the differences are in the micrometer range. A graphic presentation of the required leads to the SQUIDs was omitted in FIG. 3 for simplicity. The detector coils 14, however, are wound in the opposite sense from the coils of the reference coil arrangement 15, as indicated by the + and − signs.

The gradiometer coils are realized on the support body 11 in a planar lithography step known per se in the form of superconducting thin-film coil arrays, for instance, of lead. In this process, the required connecting lines, indicated by lines 19, of the individual coils with each other, as well as their crossings can be realized as thin-film structures.

Figure 3:
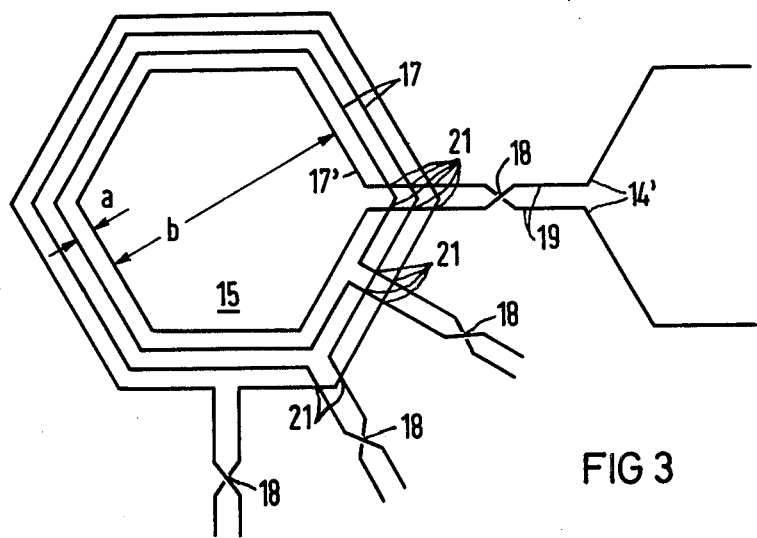
FIG. 3 shows schematically the reference coil arrangement for the gradiometer coil system of FIG. 2 illustrated in greater detail.

In FIG. 3, the reference coil arrangement 15 shown in FIG. 2 is shown magnified, like parts being provided with the same reference symbols. As shown in FIG. 3, this coil arrangement is composed of N individual subloops which surround each other quasi-concentrically. The distance a between adjacent subloops may be, for instance, about 4 $\mu$m. Each of these subloops which are formed, for instance, of a superconducting strip about 0.5 $\mu$m thick and 2 $\mu$m wide, represents a compensation coil for a particular detection coil 14, each subloop having the same area as its associated compensation coil. It follows that all detection coils 14 have a slightly different size among themselves. The distance b between parallel sides of the innermost subloop, designated 17', of the reference coil arrangement 15, is, for instance, about 20 mm. In FIG. 3, only the detection coil 14' associated with the innermost subloop 17' is partially detailed. For the N first-order gradiometers of the coil system according to the invention, N identical crossings 18 in the connecting lines 19 between each compensation coil loop 17 and its associated detection coil 14 are required. In addition, there are furthermore N−1 different crossings 21 between the compensation coil loops 17 and the connecting lines 19. Corresponding crossings can be made, for instance, with a lithography in which two metallizing planes are provided, between which an insulating plane is arranged. In FIG. 3, a graphic representation of the connecting leads of the SQUIDs was omitted. After the gradiometer coil system is assembled on the support body 11, a one-time adjustment of the coil is made. For this purpose, a laser beam can, in particular, be used, with which the width of the individual coil turns can be reduced.

With the gradiometer coil system according to the invention, the desired lines of equal magnetic field intensity, the isofield contours, can be obtained in a relatively simple manner from the measured signal values. See, e.g., the above-mentioned article from "Review of Scientific Instruments". With each of the N planar first-order gradiometers, a signal value can be measured which is interpreted as the differential field value. This signal value is $\phi_i - \bar{\phi}_i$ with $1 \leq i \leq N$, where $\phi_i$ is the magnetic flux change in the $i^{th}$ detection coil 14 and $\bar{\phi}_i$, the corresponding flux change in the corresponding compensation coil 17 of the reference coil arrangement. These signal values can be assigned spatially, for instance, to the center of the $i^{th}$ detection coil. The area covered by the gradiometer coil system can be extended by suitable overlapping measurements. The isofield contours are then calculated by interpolation and contain an additive term which is only dependent on the time. This, however, is immaterial for determining the location and direction of the source. The less important source intensity remains unknown. It can, however, be meaured additionally with an axial 1-channel equipment.

Higher-order gradiometer systems also can be realized without difficulty with the gradiometer coil system according to the invention, since for a second-order system, for instance, only two of the gradiometer coil systems shown in FIGS. 2 and 3 need to be arranged on top of each other in the axial direction. A series connection of the corresponding gradiometers of both systems having opposite winding sense then must be provided. The parts of such a second-order system therefore consist of completely balanced first-order gradiometers which only need to be aligned plane-parallel to each other. Still higher-order gradiometer systems can be constructed similarly.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than a restrictive sense.

What is claimed is:

1. In a superconducting gradiometer coil system for an apparatus for the multi-channel measurement of non-stationary weak magnetic fields in a field intensity range of less than $10^{-10}$T and in particular less than $10^{-12}$T, said apparatus including in each channel gradiometer means having at least one magnetic field detection coil and at least one magnetic field compensation coil associated with said detection coil, a superconducting quantum interference device, superconducting connecting means connecting said gradiometer means to said superconducting quantum interference device, and which further comprises electronic means for evaluating, processing and displaying data generated by said superconducting quantum interference device, the improvement comprising each of said detection coils and each of said compensating coils being connected together by mutual connecting elements and being deposited as planar thin-film structures in at least one plane on a common rigid support body, the compensation coil for each of said detection coils being disposed in one location in a reference coil arrangement about which said detection coils are disposed.

2. The improvement recited in claim 1, wherein said compensation coils of the reference coil arrangement are formed at least partially of individual loops which enclose each other and are arranged in one plane.

3. The improvement recited in claim 2, wherein said detection coils and their associated compensation coils have the same area.

4. The improvement recited in claim 1 wherein said detection and compensation coils have one of a hexagonal, round or regular polygonal shape.

5. The improvement recited in claim 1 wherein said superconducting quantum interference devices and said superconducting connecting means connecting said gradiometer means and said superconducting quantum interference devices are deposited on said support body.

6. The improvement recited in claim 1 wherein the support body comprises substantially quartz or silicon.

7. The improvement recited in claim 1 wherein said gradiometer means comprises gradiometer means having an order of at least two, and further comprising a plurality of support bodies corresponding to said order, each having gradiometer means of the first order, and wherein said gradiometer means are disposed in parallel planes relative to each other and corresponding coils in adjacent planes have opposite winding directions.

8. The improvement recited in claim 1, wherein said superconducting quantum interference device comprises a direct current superconducting quantum interference device.

* * * * *